(12) United States Patent
Chang et al.

(10) Patent No.: US 6,538,292 B2
(45) Date of Patent: Mar. 25, 2003

(54) TWIN BIT CELL FLASH MEMORY DEVICE

(75) Inventors: Kent Kuohua Chang, Taipei (TW);
Fuh-Cheng Jong, Tai-Nan (TW)

(73) Assignee: Macronix International Co. Ltd., Hsin-Chu (TW)

( * ) Notice: Subject to any disclaimer, the term of this patent is extended or adjusted under 35 U.S.C. 154(b) by 50 days.

(21) Appl. No.: 09/820,294

(22) Filed: Mar. 29, 2001

(65) Prior Publication Data

US 2002/0149066 A1 Oct. 17, 2002

(51) Int. Cl.[7] .............................................. H01L 29/76
(52) U.S. Cl. ...................... 257/391; 257/390; 257/368; 438/217; 438/276; 438/289
(58) Field of Search ................................. 257/390, 391, 257/368; 438/217, 276, 289

(56) References Cited

U.S. PATENT DOCUMENTS 5,185,646 A * 2/1993 Mizuno ...................... 257/390
5,483,487 A * 1/1996 Sung-Mu ................ 365/185.33
6,051,470 A * 4/2000 An et al. ..................... 438/283

* cited by examiner

Primary Examiner—Nathan J. Flynn
Assistant Examiner—Scott R. Wilson
(74) Attorney, Agent, or Firm—Winston Hsu

(57) ABSTRACT

A semiconductor wafer comprises a semiconductor substrate of a first conductive type, a source and a drain of a second conductive type positioned in predetermined areas of the semiconductor substrate, and a channel positioned on the surface of the semiconductor substrate between the source and the drain. The memory device contains a first dielectric layer covering the surface of the channel. A conductive layer covers the surface of the first dielectric layer, the conductive layer containing an insulating region for separating the conductive layer so as to form two isolated conductive regions. A second dielectric layer covers the surface of the conductive layer. A gate covers the surface of the second dielectric layer. Each conductive region is used as a charge trapping layer so as to receive and store electrons injected into the conductive region, thus forming a twin bit cell flash memory device.

6 Claims, 3 Drawing Sheets

TWIN BIT CELL FLASH MEMORY DEVICE

BACKGROUND OF THE INVENTION

1. Field of the Invention

The present invention relates to a method of fabricating a flash memory cell, and more particularly, to a method of fabricating a flash memory cell having a self-aligned floating gate structure and enhanced coupling ratio characteristics.

2. Description of the Prior Art

A read only memory (ROM) device, comprising a plurality of memory cells, is a semiconductor device with a primary function as memory storage. The ROM device is widely used in computer data storage and memory. Depending on the method of storing data, the ROM can be divided into several types such as mask ROM, programmable ROM (PROM), erasable programmable ROM (EPROM), and electrically erasable programmable ROM (EEPROM).

Differing from other types of ROMs that use a polysilicon or metal floating gate, a nitride read only memory (NROM) uses an insulating dielectric layer as a charge-trapping medium. Due to the highly-compacted nature of the silicon nitride layer, hot electrons tunneling from the MOS transistor into the silicon nitride layer are trapped to form an unequal concentration distribution so as to increase data reading speeds and avoid current leakage.

Please refer to FIG. 1 to FIG. 4. FIG. 1 to FIG. 4 are schematic diagrams of a prior art method for fabricating an NROM. As shown in FIG. 1, according to the prior art for fabricating a gate of the NROM, a semiconductor wafer 10 comprising a P-type silicon 12 is first provided. A low temperature oxidation process within a temperature range of 750° C.~1000° C. is then performed, to form an oxide layer with a thickness of 50–150 angstroms as a bottom oxide layer 14 on the surface of the silicon substrate 12. Low-pressure chemical vapor deposition (LPCVD) is used to deposit a silicon nitride layer 16 with a thickness of 20–150 angstroms on the bottom oxide layer 14, which functions as a charge trapping layer. Finally, an annealing process is performed under a high temperature of 950° C. for a duration of 30 minutes to repair the structure of the silicon nitride layer 16. Water steam is injected to perform a wet oxidation process to form a silicon oxy-nitride layer with a thickness of 50 to 150 angstroms as a top oxide layer 18. The bottom oxide layer 14, the silicon nitride layer 16 and the top oxide layer 18 comprise an ONO dielectric structure 20 on the surface of the silicon substrate 12.

Please refer to FIG. 2. FIG. 2 shows a photoresist layer 22 formed on the surface of the ONO dielectric structure 20, and a photolithographic and etching process performed to form patterns in the photoresist layer 22 for defining the position of a bit line. Following that, the patterns of the photoresist layer 22 are used as a mask for performing a dry etching process to remove the top oxide layer 18 and the silicon oxide layer 16 which are not covered by the photoresist layer 22, and to etch portions of the bottom oxide layer 14 to a predetermined depth. An arsenic (As) ion implantation process is performed with an ion concentration of $2\sim4\times10^{15}/cm^2$ and with an energy of 50 Kev for forming a plurality of doped areas in the silicon substrate 12, which function as bit lines 24, i.e. buried drains of the memory device. Thereafter, the photoresist layer 22 is completely removed.

As FIG. 3 shows, a thermal oxidation process is used to form a field oxide layer 26 on the top surface of bit lines 24 for separating each silicon oxide layer 16 and simultaneously to activate the dopants in each bit line 24. Finally, as FIG. 4 shows, a polysililcon layer or a polysilicide layer is deposited on the surface of the ONO dielectric structure 20 that functions as a word line 28.

Since an NROM uses the charge trapping layer as a charge storage medium, hot electrons injected in the charge trapping layer during programming of the device will form a distribution curve with respect to injection energy. When an erasing process is performed, electric holes must be injected into the charge trapping layer to neutralize the electron charges stored in the charge trapping layer. However, the mass of an electron differs greatly from that of the electric hole. Therefore the distribution curve of electric holes injected into the charge trapping layer cannot completely overlap the distribution curve of injected electrons, leading to an incomplete erasure.

SUMMARY OF THE INVENTION

It is therefore a primary objective of the present invention to provide a structure of a twin bit cell flash memory device and to solve the problem of incomplete erasure that occurs in the NROM of the prior art.

The present invention provides a twin bit cell flash memory device. The memory device is positioned on the surface of a semiconductor wafer. The semiconductor wafer comprises a semiconductor substrate of a first conductive type, a source and a drain of a second conductive type, each positioned in a respective predetermined area of the semiconductor substrate, and a channel positioned on the surface of the semiconductor substrate between the source and the drain. The memory device contains a first dielectric layer covering the surface of the channel, a conductive layer formed and covering the surface of the first dielectric layer and the conductive layer containing another insulating region for separating the conductive layer so as to form two isolated conductive regions. The memory device also contains a second dielectric layer formed and covering the surface of the conductive layer, and a gate formed and covering the surface of the second dielectric layer. The two conductive regions are used as a charge trapping layer to receive and hold electrons injected into the conductive region, so forming a twin bit cell flash memory device.

The present invention uses a conductive layer as a charge trapping layer and uses an oxidation region to separate the charge trapping layer into two isolated charge capture regions. Hence, the two regions can be respectively read and be programmed so as to form a twin bit cell structure. Additionally, the stored electrons can distribute uniformly in the conductive layer, therefore preventing the problem of incomplete erasure of NROM according as suffered in the prior art.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
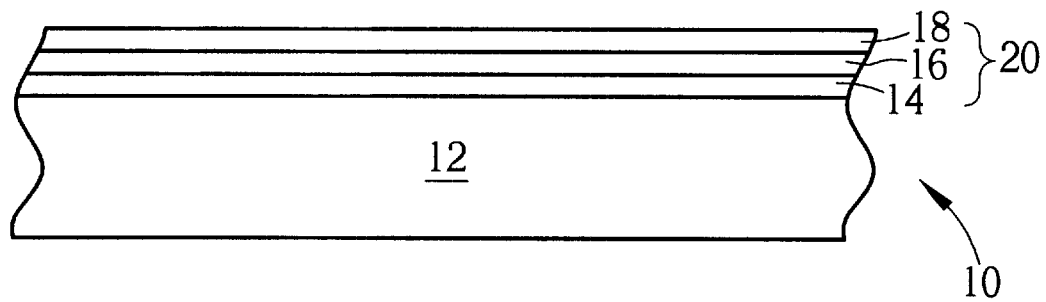
FIG. 1 to FIG. 4 are schematic diagrams of a prior art method for fabricating an NROM.
Figure 2:
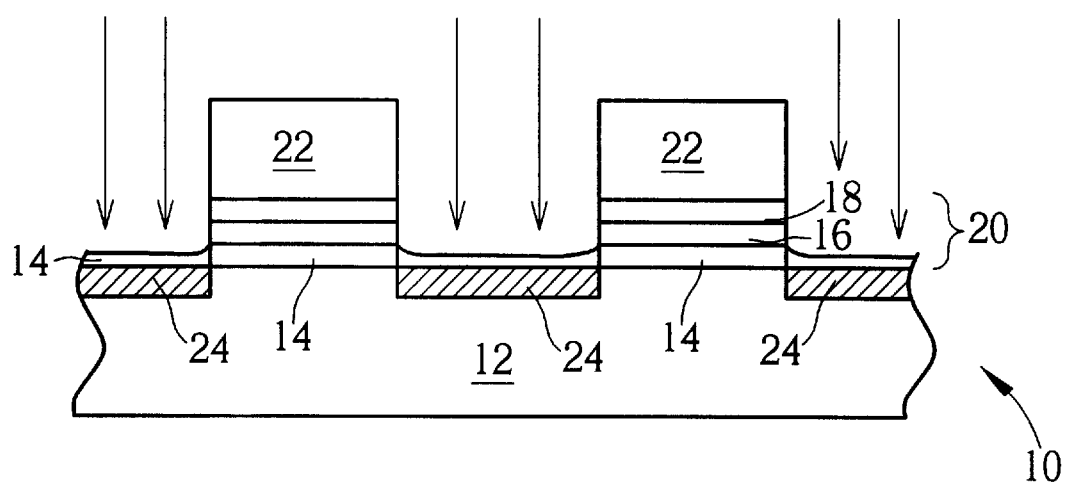
Figure 3:
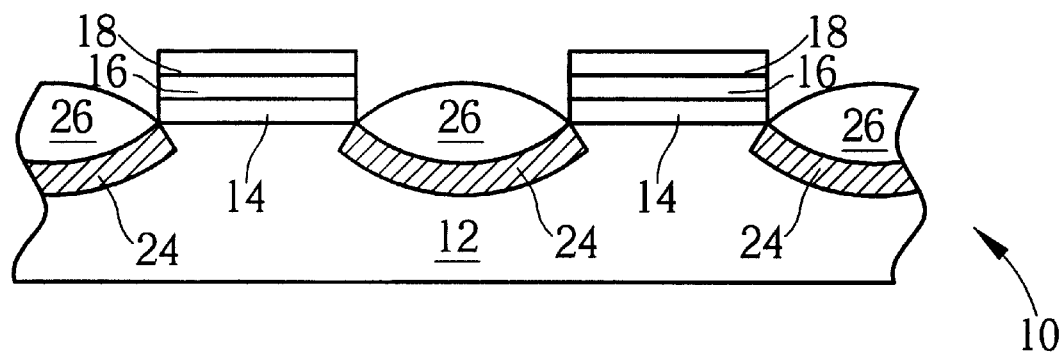
Figure 4:
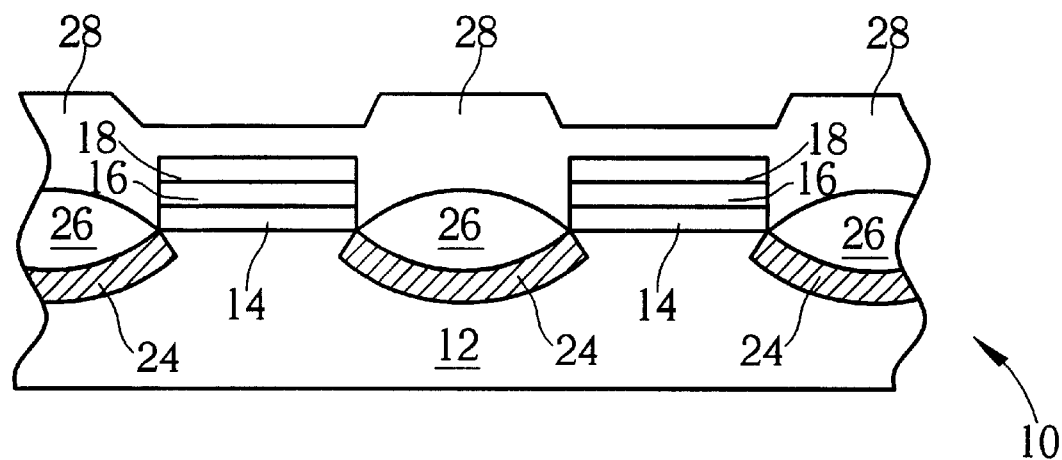
Figure 5:
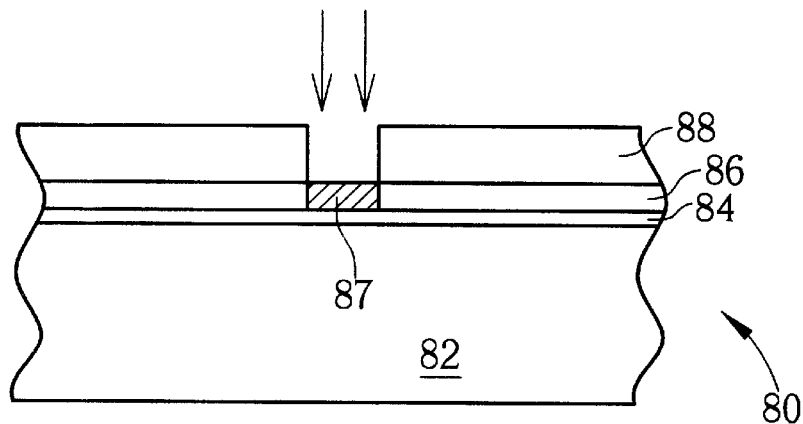
FIG. 5 to FIG. 7 are schematic diagrams of the present invention method for fabricating a twin cell flash memory device.
Figure 6:
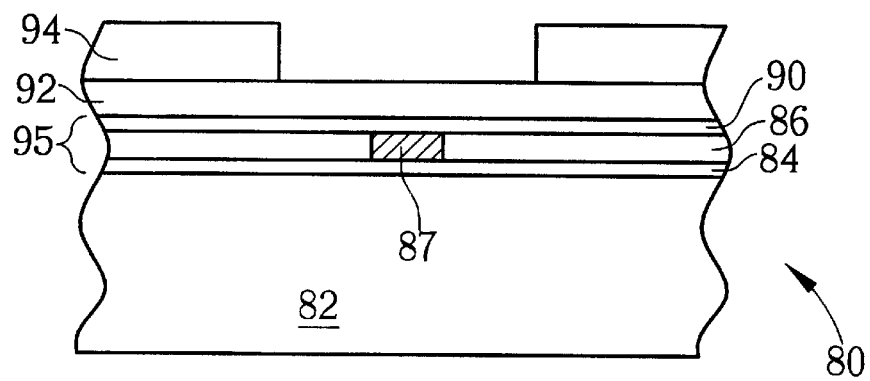
Figure 7:
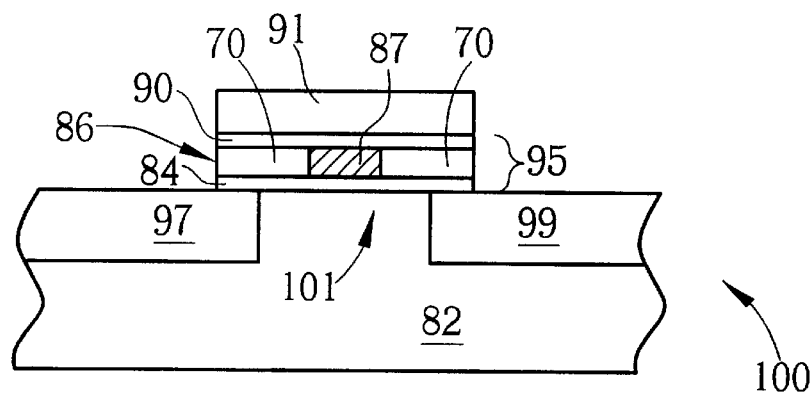

Please refer to FIG. 5 to FIG. 7. FIG. 5 to FIG. 7 are schematic diagrams of the present invention method for fabricating a twin cell flash memory device. As shown in FIG. 5, according to the present invention for fabricating a twin bit cell flash memory device, a semiconductor wafer 80 comprising a P-type silicon substrate 82 is first provided. A high temperature oxidation process is performed to form a silicon oxide layer with a thickness of 50 to 150 angstroms as a gate oxide layer 84 on the surface of the silicon substrate 82. Then, low-pressure chemical vapor deposition (LPCVD) deposits a doped polysilicon layer or a doped amorphous silicon layer with a thickness of 500 to 1000 angstroms on the surface of the gate oxide layer 84, which functions as a conductive layer 86. A photoresist layer 88 is formed on the surface of the conductive layer 86, and patterns of isolation regions 87 in the conductive layer 86 are defined in the photoresist layer 88. Ion implantation is performed to implant a high concentration of oxygen dopant, or a high concentration of nitrogen dopant, into the conductive layer 86. The implanting dose for oxygen ions is $1\sim2\times10^{18}/cm^2$, with an implanting energy of 20 to 80 KeV, and the implanting dose for nitrogen ions is $1\times10^{18}\sim5\times10^{19}/cm^2$, with an implanting energy of 15 to 40 KeV. A high temperature annealing process with a temperature range of 950° C. to 1150° C. is then performed to react the dopants implanted in the conductive layer 86 with the doped polysilicon or doped amorphous silicon for forming an isolation region 87 composed of silicon oxide or silicon nitride, which separates the conductive layer 86 into two isolated floating gates. The silicon oxide or silicon nitride comprising the isolation region 87 is also formed by reacting the dopants implanted in the conductive layer 86 with doped polysilicon or doped amorphous silicon of the conductive layer 86 during the subsequent high temperature driving-in process performed to form sources and drains of the memory device.

As FIG. 6 shows, a silicon oxide layer with a depth of 50 to 150 angstroms is formed on the surface of the conductive layer 86 and functions as a dielectric layer 90. Low-pressure chemical vapor deposition (LPCVD) is performed to form a polysilicon layer 92 on the surface of the dielectric layer 90. Thereafter, a photoresist layer 94 is formed on the surface of the polysilicon layer 92, and patterns of controlling gates are defined in the photoresist layer 94. An etching process using the patterns of the photoresist layer 94 as a mask is performed to etch the polysilicon layer 92 and the stack gate 95 until the surface of the silicon substrate 82 is reached. Finally, ion implantation is used to form a source 97 and a drain 99 on the surface of the silicon substrate 82 around the stacked gate 95, so forming a structure of a twin bit cell flash memory, as shown in FIG. 7. Alternatively, a floating gate with a twin bit cell and a dielectric layer 90 can be formed, and then a polysilicon layer 92 formed, so defining patterns of control gates. This will result in an increased contact area between control gates and floating gates.

Please refer to FIG. 7. FIG. 7 is a cross-sectional diagram of the structure of a twin bit cell flash memory device 100 according to the present invention. The twin bit cell flash memory device 100 contains a stacked gate 95, a source 97 and a drain 99. There is a channel 101 on the surface of the substrate 82 between the source 97 and the drain 99. The stacked gate 95 comprises a gate oxide layer 84, a conductive layer 86, a dielectric layer 90 and a control gate 91 formed in sequence on the surface of the channel 101.

The conductive layer 86 contains another isolation region 87 separating the conductive layer 86 into two isolated conductive regions 70, i.e. floating gates, so as to form a twin bit cell structure. Each conductive region 70 functions as a charge trapping layer to receive and hold electrons injected into the conductive region 70, so forming a bit. The quantity of electrons received and stored in each conductive region 70 is predefined so as to provide the twin bit cell flash memory device 100 with a first threshold voltage greater than a first selected value when the memory device 100 is reading in a first direction opposite to which it was programmed. The stored electrons also provide the memory device 100 with a second threshold voltage when the memory device 100 is reading in a second direction that is the same direction to which it was programmed. The second threshold voltage is substantially lower than the first threshold voltage.

The twin bit cell flash memory device according to the present invention uses a conductive layer as a charge trapping layer, and an isolating region is formed in the conductive layer to separate the conductive layer into two isolated charge capture regions. Hence, the two regions can be respectively read and programmed so as to form a twin bit cell structure.

In contrast with the NROM manufactured by the prior art method, the present invention provides a structure of a twin bit cell flash memory device so as to increase the integration of the memory device without reducing critical dimensions of the wafer in different processes. Therefore, misalignment that occurs during the photolithographic process for defining floating gates in the photoresist layer, and which leads to lower process yields, is prevented. As well, the problem of incomplete erasure of NROM according to the prior art is prevented because of the use of a conductive layer as a charge trapping layer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A twin bit cell flash memory device, the device comprising:

a semiconductor substrate of a first conductive type;

a source of a second conductive type positioned in a predetermined area of the semiconductor substrate;

a drain of the second conductive type positioned in another predetermined area of the semiconductor substrate, the drain and the source separated by a predetermined distance;

a channel positioned on the surface of the semiconductor substrate between the source and the drain;

a first dielectric layer covering the surface of the channel;

a conductive layer covering the surface of the first dielectric layer, the conductive layer having an insulating region positioned in-between the source and the drain for separating the conductive layer and forming two isolated conductive regions so as to form a twin bit cell structure;

a second dielectric layer covering the surface of the conductive layer; and a gate covering the surface of the second dielectric layer.

2. The flash memory device of claim 1 wherein the conductive layer is a doped polysilicon layer or a doped amorphous silicon layer, and the insulating region is formed by implanting a high concentration of oxygen dopant into the doped polysilicon layer or the doped amorphous silicon layer, and then performing a thermal process.

3. The flash memory device of claim 2 wherein the high concentration of oxygen dopant is formed by an oxygen ion implantation process, the implanting dosage being approximately $2\times10^{18}/cm^2$, the implanting energy ranging from 20 KeV to 80 KeV.

4. The flash memory device of claim 2 wherein the thermal process is a high temperature annealing process with a temperature range of 950° C. to 1150° C.

5. The flash memory device of claim 1 wherein the conductive layer is a doped polysilicon layer or a doped amorphous silicon layer, and the insulating region is formed by implanting a high concentration of nitrogen dopant into the doped polysilicon layer or the doped amorphous silicon layer, and then performing a thermal process.

6. The flash memory device of claim 1 wherein the first and second dielectric layers both comprise silicon oxide.

* * * * *